United States Patent
Griesinger et al.

(10) Patent No.: US 6,838,216 B2
(45) Date of Patent: Jan. 4, 2005

(54) PHOTOLITHOGRAPHIC MASK AND METHODS FOR PRODUCING A STRUCTURE AND OF EXPOSING A WAFER IN A PROJECTION APPARATUS

(75) Inventors: Uwe Griesinger, Anzing (DE); Mario Hennig, Dresden (DE); Jürgen Knobloch, Waakirchen (DE); Rainer Pforr, Dresden (DE); Manuel Vorwerk, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/438,370
(22) Filed: May 14, 2003

(65) Prior Publication Data
US 2004/0038135 A1 Feb. 26, 2004

Related U.S. Application Data

(63) Continuation of application No. PCT/DE01/04263, filed on Nov. 14, 2001.

(30) Foreign Application Priority Data

Nov. 14, 2000 (DE) .......................................... 100 56 262
Jun. 1, 2001 (DE) .......................................... 101 26 838

(51) Int. Cl.⁷ .............................. G03F 9/00; G06F 17/50
(52) U.S. Cl. ............................................. 430/5; 716/21
(58) Field of Search ............................ 430/5, 322, 323, 430/394; 716/19, 21

(56) References Cited

U.S. PATENT DOCUMENTS

| 5,229,230 A | 7/1993 | Kamon ........................ 430/5 |
| 5,578,422 A | 11/1996 | Mizuno et al. ................. 430/5 |
| 2004/0038135 A1 * | 2/2004 | Griesinger et al. ............ 430/5 |

* cited by examiner

*Primary Examiner*—S. Rosasco
(74) *Attorney, Agent, or Firm*—Laurence A. Greenberg; Werner H. Stemer; Gregory L. Mayback

(57) ABSTRACT

Auxiliary openings are assigned to openings on a mask to be transferred to a wafer. These auxiliary openings have a phase-shifting property, preferably between 160° and 200° with respect to the openings, and a cross section lying below the limiting dimension for the printing of the projection apparatus, so that the auxiliary openings themselves are not printed onto the wafer. However, the auxiliary openings do enhance the contrast of the aerial image, in particular of an associated, isolated or semi-isolated opening on the wafer. The auxiliary openings may have a distance from the opening that lies above the resolution limit of the projection apparatus but that is less than the coherence length of the light used for the projection. A phase-related utilization of the optical proximity effect results, which can produce elliptical structures from square openings on the mask when the auxiliary openings are disposed in the preferential direction.

12 Claims, 6 Drawing Sheets

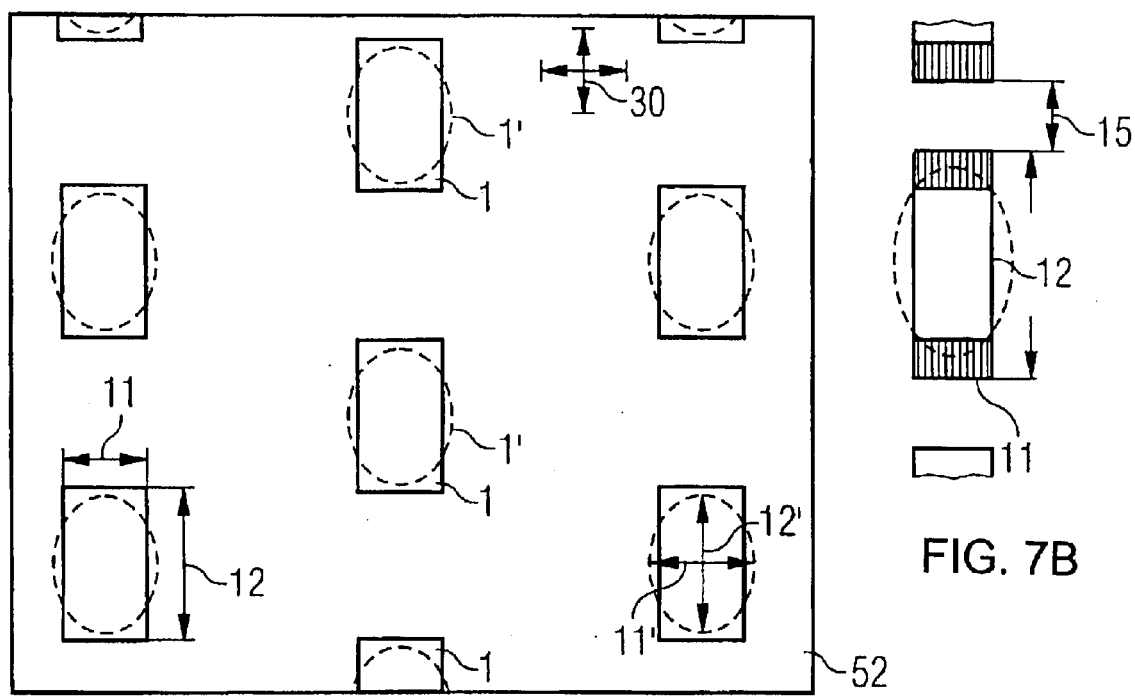

FIG 8A
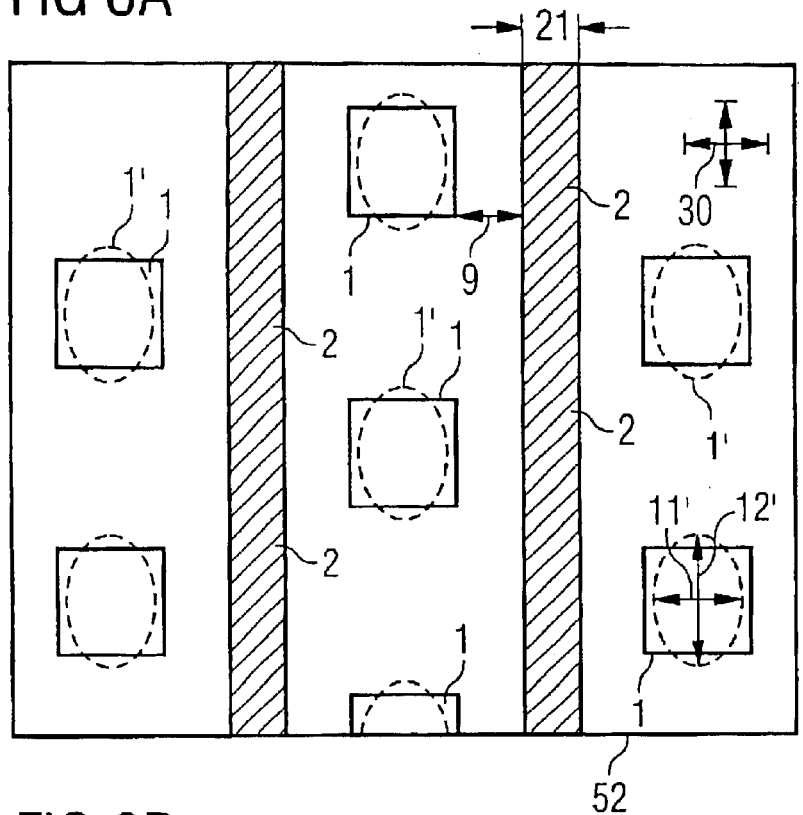
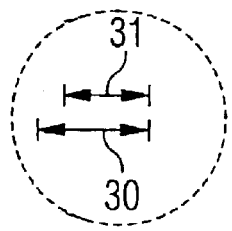
FIG. 8C
FIG 8B
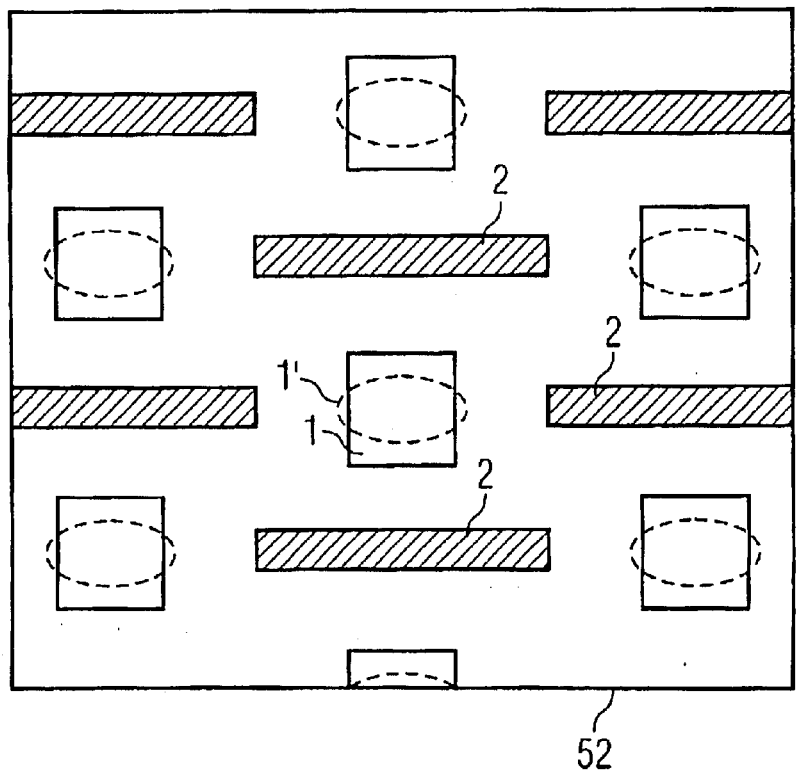

PHOTOLITHOGRAPHIC MASK AND METHODS FOR PRODUCING A STRUCTURE AND OF EXPOSING A WAFER IN A PROJECTION APPARATUS

CROSS-REFERENCE TO RELATED APPLICATION

This is a continuation of International application PCT/DE01/04263, filed Nov. 14, 2001, which designated the United States and which was not published in English.

BACKGROUND OF THE INVENTION

Field of the Invention

The present invention relates to photolithographic masks, in particular, to photolithographic masks for structuring radiation-sensitive resist layers on semiconductor substrates in order to produce highly integrated semiconductor components.

Projection apparatuses operating with optical light normally in the ultraviolet length range are in widespread use as wafer steppers or scanners, as they are known, in the production of semiconductor products. By using regions that are transparent or opaque to radiation, that is to say opaque, defined structures, which are typically formed on a Quartz plate as a mask, are transilluminated with coherent, monochromatic light and, via a lens system, and are brought to form an image on a wafer coated with a light-sensitive resist.

As a rule, sets of the masks provided by the structured quartz plates are used in order to build up the layers or the levels on a wafer gradually. In the production of integrated circuits on a wafer, the physical resolution limits for the optical projection limit the possible structure sizes of individual planes. One typical example is specific planes for the production of memory products (DRAM). For the resolution of the image, it is true that:

$$b_{min} = k_l * \lambda / NA \quad (1)$$

Here, $b_{min}$ is the minimum structure line width, $\lambda$ is the wavelength of the monochromatic light, and NA is the numerical aperture of the imaging lens system. The coefficient $k_l$, includes, firstly, techniques utilizing the diffraction characteristics of the light, such as oblique-light illumination, phase-shifting structures or OPC structures (optical proximity correction), as they are known, and secondly, this factor also accounts for problems such as lens faults leading to aberration (coma, chromatism).

The minimum structure line width on the mask, which is actually produced after the production of the resist structure, is often calculated to be larger than from equation (1), for several reasons. Firstly, the resist layer has a finite thickness, so that the image is easily smeared; furthermore, the developer acts isotropically, so that during the development of the resist layer, the resist is also removed in the lateral direction. The minimum structure line width on the mask that is needed for the production of a resist layer structure on a semiconductor substrate therefore depends on many parameters and is determined individually for each structuring process.

Various effects can contribute to impairing the fidelity of the mask. Firstly, the finite resist contrast $\lambda$, which is a measure of the resist-remove gradient, causes originally angular mask structures to be rounded. Furthermore, interference effects, diffraction effects and scattered light, which arise at structure elements of the mask, the resist layer, and/or the pre-structured substrate surface, lead to the effective exposure dose not being homogeneous in the resist layer areas.

FIG. 1 illustrates the aforementioned difficulties on a conventional lithographic mask, which has a substrate 51 transparent to radiation, for example made of glass, and a layer 52 opaque to radiation, for example made of chromium. In this case, the openings 1 in the layer 52 opaque to radiation correspond to the structure that is to be transferred to the photoresist layer on the wafer in an appropriate masking step. During an exposure, radiation—for example ultraviolet light—passes through the openings 1 in the layer 52 opaque to radiation and, because of interference effects, leads to the distribution illustrated of the electrical field E in the photoresist layer on the wafer.

Because of interference effects, undesired exposure in the photoresist layer occurs between the openings 1 and 4, an actual dark region on the mask. Since the exposure intensity is proportional to the square of the field strength, the field strength distribution shown in FIG. 1 leads to a corresponding intensity distribution I in the photoresist layer.

In order to avoid these difficulties and to improve the structure resolution, use is therefore also increasingly being made of "alternating phase masks" instead of the "dark field masks" previously described. In this case, each second opening 4 in the layer 52 opaque to radiation has a phase variation applied to it, for example by etching the glass substrate 51, such that a phase difference between adjacent openings 1 and 4 is achieved. As a rule, 180° is set as the phase difference. By applying this technique, in the case of highly periodic, grid-like structures, an increase of up to a factor 2 can be achieved in the structure resolution, as compared with the conventional technique.

FIG. 2 illustrates the situation that results. Because of the 180° phase difference between adjacent openings 1, there is now destructive interference between the radiation that passes through the left-hand opening 1 and the radiation that passes through the right-hand opening 4. The field distribution E in the photoresist layer therefore now has a zero point between the two openings 1, which therefore also leads to a distinctly lower intensity I between the two openings 1. In this way, the contrast of the exposure is increased considerably.

However, this positive effect occurs only for structures opaque to radiation which, on two opposite sides, have an opening with a phase difference. Since the patterns formed by the openings correspond to the structures that are to be imaged or transferred into the photoresist layer, it is, however, possible for situations to occur in which openings with only one adjacent opening or completely isolated openings occur. In this case, it is possible for such a semi-isolated or completely isolated opening not to be imaged completely into the resist layer. Until now, attempts have been made to ensure transfer into the photoresist layer by widening the corresponding openings, at least under optimum lithographic conditions (optimum focus, nominal exposure). However, the lithographic process window is then so small that the corresponding structures often lead to failure of the component in the fabrication process. Accordingly, this technique is only used in rare cases in practice, which results in critical structures in the layout having to be forbidden, but this results in a drastic restriction in the use of alternating phase masks.

SUMMARY OF THE INVENTION

It is accordingly an object of the invention to provide a photolithographic mask and methods for producing a structure and of exposing a wafer in a projection apparatus that overcome the hereinafore-mentioned disadvantages of the heretofore-known devices of this general type and that provide a photolithographic mask that reduces the above-described problems or avoids them entirely and which, in particular, is also capable of transferring isolated structures into the photoresist layer with a high resolution.

With the foregoing and other objects in view, there is provided, in accordance with the invention, a photolithographic mask for exposing radiation-sensitive resist layers on semiconductor substrates is provided, the mask a) having at least one layer opaque to radiation on a transparent carrier material, b) at least one opening being provided in the layer opaque to radiation, the at least one opening being formed in such a way that the pattern formed by the at least one opening is transferred into the resist layer during an exposure, and c) at least one auxiliary opening being provided in the layer opaque to radiation, the at least one auxiliary opening being formed in such a way that the pattern formed by the at least one auxiliary opening is not transferred into the resist layer during an exposure, and as the radiation passes through the at least one auxiliary opening, a phase difference being produced with respect to the radiation through an adjacent opening or an adjacent auxiliary opening.

Throughout the application, the term "opening" (as distinguished from "auxiliary opening") is synonymous with the term "primary opening".

The photolithographic mask according to the invention provides for the application of auxiliary openings in addition to the actual openings determining the structure. In the case of an association according to the invention between opening and auxiliary opening, the opening will also be referred to as a mother structure below. In this case, the auxiliary openings have a phase variation matched to the adjacent openings. Within the context of the present application, two openings are referred to as adjacent when the radiation that passes through the two openings gives rise to substantial interference effects. With the auxiliary openings, it is possible to achieve a considerable improvement in the aerial image contrast, especially outside the image plane, and therefore to ensure a considerably enhanced depth of focus. Since the auxiliary openings are formed in such a way that they are not imaged in the photoresist, they may also be referred to as sub-resolution phase assist structure (SPAS).

The use of these auxiliary openings leads to a considerable enlargement in the process window, in particular in the case of isolated or semi-isolated structures, and also to a reduction in the difference in the line width relating to closely packed structures. It further permits the exposure of circuit-typical layouts in a single exposure, instead of with a double exposure—as in the prior art—and therefore with twice the productivity. The openings often have a rectangular shape. The openings generally are considerably longer than they are wide. In this case, the auxiliary openings are preferably formed parallel to the actual openings.

According to a preferred embodiment, the width of the auxiliary openings is selected to be less than 0.3 λ/NA. In this case, λ designates the wavelength with which exposure is carried out, and NA the numerical aperture.

Furthermore, it is preferred for at least one auxiliary opening to be provided in relation to a semi-isolated opening. Within the context of the present application, an opening is referred to as semi-isolated if it has an adjacent opening only in one direction. In the case of a semi-isolated opening, at least one auxiliary opening, is therefore provided, which replaces the "missing" adjacent opening in the opposite direction.

Furthermore, it is preferable if at least two auxiliary openings are provided in relation to an isolated opening. Within the context of the present application, an opening is referred to as isolated if it does not have any adjacent opening. In the case of an isolated opening, therefore, at least two auxiliary openings are provided, which replace the "missing" adjacent openings.

According to a preferred embodiment, as the radiation passes through adjacent openings, a phase difference of 180° in relation to each other is produced in each case. Furthermore, it is preferred if, as the radiation passes through an auxiliary opening and its adjacent opening or its adjacent auxiliary opening, a phase difference of 180° is produced.

Furthermore, it is preferred if the openings and/or the auxiliary openings form a grid-like pattern. In this case, it is preferred if the auxiliary openings are disposed at a distance from the adjacent opening or auxiliary opening which amounts to approximately 0.3 to 0.7 times the period of the grid.

In a particularly advantageous development, the at least one opening has a rectangular structure, while the at least one auxiliary opening has a cross section below a limiting dimension, which describes the minimum structure extent on the mask necessary to form a structure on the semiconductor substrate, is in each case disposed at a distance from the at least one opening, the distance a) being greater than the resolution limit of the projection apparatus used for the exposure, based on the wafer scale, and b) being less than the coherence length of the light used in the projection apparatus, as the radiation passes through, a phase difference is produced with respect to the radiation through an adjacent opening.

In order to escape from the high requirements in the abovementioned critical planes, distressing of the overlay, that is to say the positional accuracy between the planes, is often desirable. Attempts have been made to expand structures on the semiconductor substrate or wafer in that coordinate direction in which, possibly, there are just not the high requirements on the minimum structure width. This applies generally when, in precisely this coordinate direction, the distances to adjacent structures on the substrate are firstly sufficiently large and secondly the functionality of the circuit is not impaired.

For the memory products mentioned at the beginning, the substrate contact-making plane can be mentioned as an example here. In this case, the conventionally square-shaped contact holes on the mask are configured as rectangular openings, the longitudinal axis of all the rectangles having the same coordinate direction. In a corresponding way, the ellipses with a similar longitudinal extent are to be formed on the wafer.

In this case, the problem previously occurred that the length to width ratio present on the mask was not transferred to the wafer in the same way. Instead, the imaged structures tend to maintain a length to width ratio lying closer to the value 1. In particular, in the case of systems with a very small coefficient $k_1$, that is to say those with intensive use of the improved lithographic techniques, it is to be recorded that—in order to obtain elliptical structures on the wafer at all—rectangles with a length to width ratio of more than 1.5 have to be structured on the mask.

The use of this technique was therefore limited to mask plane layouts with relatively great distances, for example the contacts in the uncritical coordinate direction. One alternative for circumventing this problem included producing an opening with an enlarged longitudinal axis on the semiconductor substrate by using a small offset in the mask in the direction of the desired coordinates in a double exposure of the semiconductor substrate. In this case, however, the disadvantage arose that, on the one hand, accurate adjustment of the offset had to be carried out, with a great deal of effort, and also that the productivity of the imaging process for all the planes involved was virtually halved. The resolution limit designates that dimension that results by referring back the scale of the resolution limit from the wafer to the mask after the projection. If the resolution limit on the wafer is, for example, 140 nm, then in the case of a 5:1 projection the result is a corresponding value of 700 nm for the mask. The size statements used below, in particular of the exemplary embodiments, relate to the wafer level, however, and therefore have to be multiplied for the mask according to the invention, depending on the type of projection, by the corresponding reduction factor, for example 4 or 5.

As a result of the property that the auxiliary opening has a dimension located in the vicinity of the resolution limit, although the opening is imaged on the substrate or wafer as an aerial image of very low contrast and enhances the contrast of the rectangular structure considered here as a mother structure, because of the low image contrast, it is itself not imaged as a structure in the resist. In this case, in particular, the limiting dimension that describes the structure formation (printing in the following text) can be greater than the resolution limit of the projection apparatus for structures on the wafer, but will generally lie very close to this limit. A reduced intensity resulting from partial absorption of the phase-shifted light passing through the auxiliary opening, and also a changed resist sensitivity of the resist on the wafer additionally determine, inter alia, the exact value of this limiting dimension for the printing on the wafer.

The intensity contributions of phase-shifted light are therefore important in relation to the formation of the mother structure, but are not sufficient for any direct imaging of the auxiliary opening as such on the wafer.

The limiting dimension for the printing may be determined directly for a projection apparatus to be used and a resist layer to be exposed, that is to say for example a layer thickness or chemical composition, etc, on a wafer with a fixed exposure intensity.

Since the distance of the auxiliary opening from the opening to be imaged lies within the coherence length range of the light, the imaging of the opening is advantageously influenced. As a result of the minimum distance, given by the invention, in accordance with the resolution limit of the projection system, this influence does not, however, lead to a direct enlargement of the area of the opening in the direction of the location of the auxiliary opening, as would be the case, for example, in the optical proximity effect with equal-phase light regions, that is to say transparent or semi-transparent regions.

As a result of the shift in the phase of the light as it passes through the auxiliary openings, and the proximity effect caused thereby, it is possible—as has been found by simulation and experiment—for the geometric shape of the aerial image and consequently that of the resist structure produced to be influenced advantageously. By using the present invention, auxiliary openings can accordingly be assigned to the openings to be imaged in such a way that the auxiliary openings themselves are not imaged, but influence the projection of the openings to be imaged in the complementary coordinate direction to such an extent that a desired expansion of the area of the structure in precisely this direction takes place, or thinning of the opening to be imaged takes place in the mother structure-auxiliary opening coordinate direction.

The present invention proves to be particularly advantageous in the production of elliptical structures on the wafer from essentially square structures on the mask. With advantageous utilization of the proximity effect caused by the assisting phase auxiliary openings, the aerial image on the mother structure-auxiliary opening axis is influenced in such a way that the dimension of the resist structure produced deviates in this coordinate from the coordinate that is vertical with respect thereto. The structure to be imaged will therefore expand in its length in this direction, while it remains limited in terms of its width in the direction of the auxiliary openings during the imaging onto the wafer. The ellipticity, that is to say the length to width ratio, can therefore be controlled through the deliberate shaping of the auxiliary openings.

As a result of this development of the present invention, there is no restriction to specific original length to width ratios of the rectangular structure. On the mask, square and pronounced rectangular mother structures can be influenced in the same way by setting up corresponding auxiliary openings.

In particular, the rectangular structures to be imaged can be set up as structures on alternating phase masks. Application of the auxiliary openings according to the invention to half-tone phase masks is likewise conceivable.

A further advantage of the present invention is the significant enlargement of the process window for the projection. For the parameters dose and focus of the exposure or projection, ranges have to be specified within which a predefined quality of the image is achieved, the ranges in each case being interdependent. A combination of both ranges for the projection is selected which, firstly, contains the best possible imaging, and secondly permits the greatest possible freedom for the parameters. It is precisely this freedom which is advantageously enlarged by the present invention in the case of a given quality limit for the image. In particular, according to the invention the depth of focus range (focus), for example for imaging a substrate contact-making plane in memory products, is improved by virtually twice as compared with conventional chromium masks.

In a further refinement of the present invention, a particularly effective range was found for the phase difference according to the auxiliary opening with respect to the rectangular structure to be imaged, which is embedded between 160° and 200°.

In a further refinement, in order to achieve the most homogeneous effect, for example in one coordinate direction, a length of at least the length of the rectangular structure to be imaged is assumed for the auxiliary opening. Since the cross section, for example the width, lies in the range of the resolution limit of the projection apparatus, which is given by $0.25*\lambda/NA$, in spite of this longitudinal expansion, the auxiliary opening is not printed on the wafer.

In a further advantageous refinement, a further auxiliary opening is provided mirror-symmetrically with respect to the previous auxiliary opening about the axis of symmetry of the at least one rectangular structure. As a result, a symmetrical longitudinal expansion of the rectangular structure is also ensured on the wafer—or a square structure as a subset of the rectangular structures.

A further advantageous refinement of the present invention involves under-structuring the auxiliary opening. For example, for a dark field mask, an auxiliary opening can include interrupted elongated holes. In turn, these intrinsically form rectangles or lines, which are interrupted from one another at a distance lying underneath the resolution limit. The action of such auxiliary openings is in this case insignificantly restricted with respect to the uninterrupted case.

According to the present invention, setting up the auxiliary opening relative to the rectangular structure is not restricted to emphasizing one coordinate direction. In order, for example, to enlarge only the process window, an alternative course is to provide auxiliary openings according to the invention on all four sides of a rectangle. For example, a rectangular frame configured as an auxiliary opening—or as a set of auxiliary openings—around the rectangular structure to be imaged also leads to an advantageous enlargement of the process window.

In a further advantageous refinement, the auxiliary openings that are associated with the rectangular structures to be imaged form, together with the latter, a regular pattern on the mask. In specific cases of the forming of a grid of rectangular structures provided in this way—for example in the case of the substrate contact-making plane in memory products—the individual auxiliary openings can be combined in their longitudinal extent to form elongated structures. The cross section of the auxiliary opening at the same time, according to the invention, satisfies the criterion of a sub-resolution structure, as it is known. The advantage resides in the fact that, according to the invention, the effect that produces an elliptical structure is achieved, while the outlay for the mask configuration and the mask itself is kept low.

As a result of a further refinement, the rectangular structure to be imaged is substantially square. In interplay with the configuration of a regular pattern of rectangles, the result here is the significant advantage that, in order to achieve any desired regular rectangular pattern on the wafer, rectangular structures which are equipped with a still larger length to width ratio no longer have to be provided on the mask in any case. Instead, these can be provided as squares on the mask, as a result of which, more interspace is produced on the mask between the structures, in particular in the case of conventional critical distances. One example will be presented below.

In a further refinement, the rectangular structure and the at least one auxiliary opening are in each case formed with different transparency for the light falling through. By using suitable selection of the transparency of the auxiliary opening, a further enlargement of the process window for the projection can advantageously be achieved. Restricted light transmissivity of the auxiliary opening during the fabrication permits the selection of a large cross section, since the limiting dimension for the printing then likewise rises.

In a further refinement, the cross section of the auxiliary opening is chosen to be smaller than the resolution limit of the optical projection system itself. The advantage here is that this variable depends substantially only on the lens system or its opening and can be specified immediately. Below this limit, of course, no printing can be carried out on the wafer either. The narrow range between minimum necessary limiting dimension for the printing as upper limit and resolution limit as lower limit, on the other hand also depends on the resist on the wafer or the type of the processes following the exposure, for example the development or etching.

In addition, the ellipticity can be controlled by adapting the numerical aperture of the projection system, it being possible for a further enlargement of the process window likewise to be achieved.

Other features that are considered as characteristic for the invention are set forth in the appended claims.

Although the invention is illustrated and described herein as embodied in a photolithographic mask and methods for producing a structure and of exposing a wafer in a projection apparatus, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 7A is a plan view of a regular pattern of contact holes in a substrate contact-making plane with openings on the mask according to the prior art;

FIG. 7B is an enlarged detailed view, in a matched scale, of the exposed ellipses formed from them on the wafer according to the prior art;

FIG. 8A is a plan view showing a regular pattern of a substrate contact-making plane having a first example of square openings and auxiliary openings shown as hatched liens;

FIG. 8B is a plan view showing a regular pattern of a substrate contact-making plane having a second example of square openings and auxiliary openings shown as hatched liens;

FIG. 8C is a partial detailed view of the substrate contact-making plane including the resolution limit and limiting dimension, which are drawn to scale in FIG. 8A;

DESCRIPTION OF THE PREFERRED EMBODIMENTS

Figure 1:
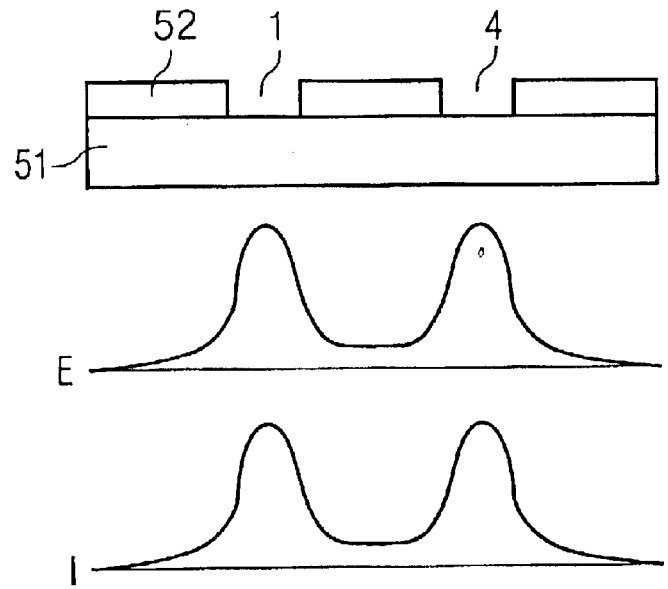
FIG. 1 is a diagrammatic sectional view of a photolithographic mask according to the prior art and resulting electrical field and intensity distributions.
Figure 2:
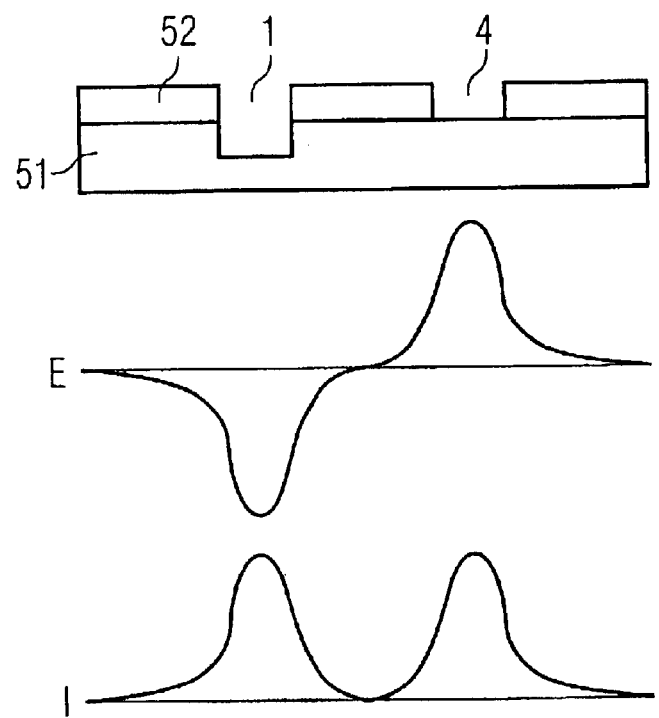
FIG. 2 is a sectional view of a further photolithographic mask according to the prior art and resulting electrical field and intensity distributions.
Figure 3:
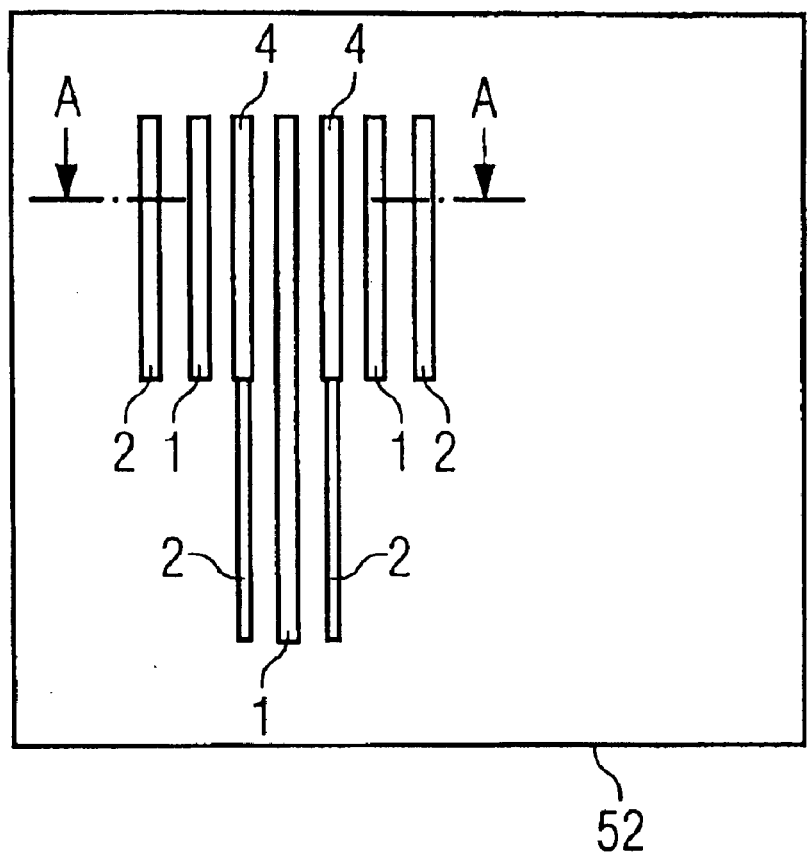
FIG. 3 is a diagrammatic plan view of a photolithographic mask according to a first embodiment of the invention.

Referring now to the figures of the drawings in detail and first, particularly to FIG. 3 thereof, there is shown a photolithographic mask according to a first embodiment of the present invention. The mask has a group of five openings 1 and 4 with a width of 0.35*λ/NA (wafer-based). They are grouped as grids with the period 0.7*λ/NA, adjacent openings 1 and 4 having a relative phase difference of 180°. Parallel with the outer openings 1, in each case an auxiliary opening 2 with a width of 0.27*λ/NA is made at a distance D of 0.7*λ/NA, the phase variation differing by 180° from the adjacent opening. The auxiliary openings 2 have the effect that the semi-isolated openings 1 are imaged with a considerably higher aerial image contrast, and the exposure method has a considerably improved lithographic process window. Because of the low intensity of their aerial image, the auxiliary openings 2 are not transferred into the resist layer.

Furthermore, provision is made for the openings 1 supported by auxiliary openings 2 to be given a width adaptation, in particular a broadening, so that under nominal exposure conditions (best focus, nominal exposure), the openings 1 are transferred into the resist layer at the same width as the adjacent, closely packed openings 4. Depending on the exposure parameters, the openings 1 supported by auxiliary openings 2 can be broadened within a range of up to 20%.

Figure 4:
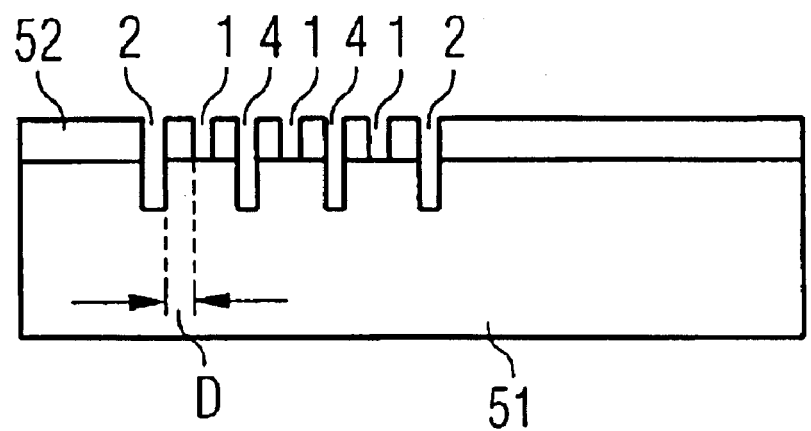
FIG. 4 is a sectional view of the photolithographic mask shown in FIG. 3 and taken along line A—A.

The isolated opening 1 standing out from the central structure is supported on both sides by auxiliary openings 2 with a width of 0.27*λ/NA. The three openings form a grid of period 0.7*λ/NA. FIG. 4 shows, schematically, a section along the line A—A in FIG. 3.

Figure 5:
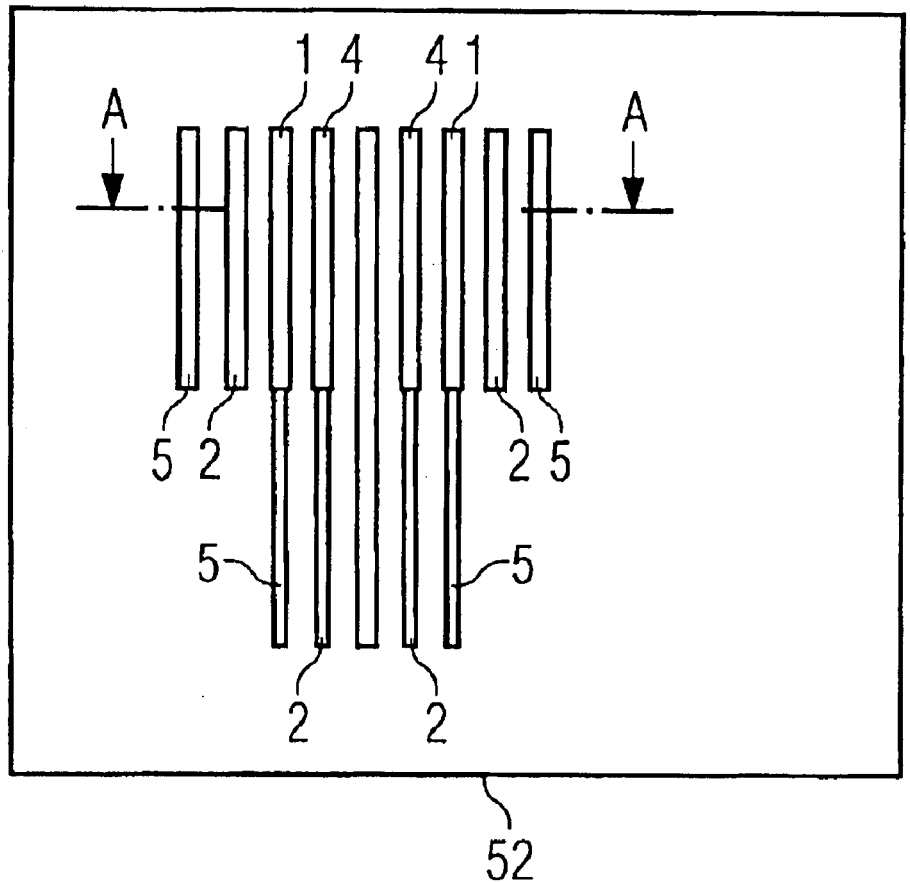
FIG. 5 is a plan view of a second embodiment of a photolithographic mask.
Figure 6:
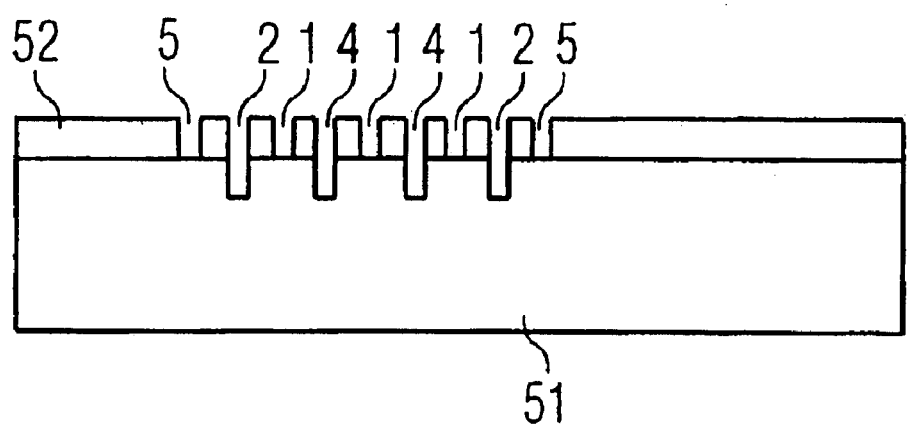
FIG. 6 is a sectional view of the photolithographic mask shown in FIG. 5 and taken along line A—A.

FIG. 5 shows a further embodiment of the photolithographic mask according to the invention. The embodiment shown in FIG. 5 is distinguished by the use of two auxiliary openings 2 and 5 for each semi-isolated opening 1 and, respectively, four auxiliary openings 2 and 5 for each isolated opening 1. In this case, the phase of the additional auxiliary opening 5 is selected such that, taking account of the opening 4 to be supported, it alternates, that is to say the auxiliary openings 2 do not have the same phase as the auxiliary openings 5. FIG. 6 shows a cross section relating to FIG. 5.

The problem of producing elliptical structures on a wafer, which are configured in a regular pattern, is illustrated in FIGS. 7A and 7B using the example of the substrate contact-making plane for producing integrated components such as memories. The illustration shows the openings or rectangular structures 1 according to the prior art on the mask and, drawn above them and in matched scale, the structures 1' imaged on the wafer as dashed ellipses. In general, in the case of the substrate contact-making plane, the openings 1 on the mask are configured as a square contact area, so that according to the prior art, circular contact holes are produced as imaged structures 1' on the wafer. In this example, the situation is such that in the case of these critical structures, that is to say standing close to the resolution limit 30, contact holes elongated in one dimension are to be produced as imaged structures 1', which is carried out here in the vertical Y direction in FIG. 7B. As FIG. 7B shows, the ratio of the length 12 of the rectangular structure 1 to its width 11 must be at least 1.5 times, in order to achieve ellipticity of the imaged structure 1' at all.

The dashed ellipses of the images structures 1' shown in the figures represent lines of the same intensity on the wafer. In the case of more intensive or less intensive exposure, however, although the are of the structure 1' changes, the length 12' to width 11' ratio of the imaged structure 1' does not change substantially with a varying intensity.

In order to produce still greater ellipticity of the imaged structures 1' on the wafer, however, one quickly runs against limits when structuring the openings 1 on the mask, as can be seen in FIG. 7 on the right hand side. In the case of the longitudinal expansion of the openings 1 in order to produce unfortunately only moderate ellipticities on the wafer, the distance 15 of the openings 1 from the respectively adjacent openings must be at least greater than the resolution limit 30. This condition disadvantageously sets an upper limit on the vertical longitudinal expansion of the imaged structures 1' as contact holes on the wafer.

An example according to the invention for solving this problem, which is shown in FIG. 8A, is based on square openings 1, whose image on the wafer, because of seamlessly joined auxiliary openings 2 which have a phase shift by 180°, are imaged as structures 1' on the wafer which have a high ellipticity. The auxiliary openings 2 have a width 21 that lies in the range of the resolution limit 30, but below the limiting dimension 31 for the printing, of the projection apparatus. The distance 9 of the auxiliary opening 2 on the mask from the opening 1, on the other hand, lies above the resolution limit 30, so that the phase-shifting auxiliary opening 2 acts on the square opening 1 as it is imaged onto the wafer, utilizing the proximity effect. For the exemplary embodiment in FIG. 8A, a projection apparatus with a wavelength of 248 nm and a numerical aperture NA=0.63, and a filling factor σ=0.30 was selected. The square contact holes 1, based on the wafer level have an extent of 230 nm×230 nm. The seamlessly adjoined auxiliary openings 2, constructed as assist columns in this exemplary embodiment, have a width 21 of 100 nm.

As a result of the square formation of the openings 1, which is made possible by the action of the auxiliary openings 2 according to the invention, the problems indicated in the explanation relating to FIG. 7 can be circumvented. The degrees of freedom for placing and forming structures on the mask are improved considerably as a result of the use according to the invention of auxiliary openings in the production of structures 1' on the wafer. During the formation of the auxiliary openings 2 and during the layout of the mask, their effect can be controlled precisely via their width 21 and via their distance 9 from the rectangular structure 1.

Likewise, a significant enlargement of the process window is achieved. At a given numerical aperture for the example according to the prior art according to FIG. 7, and the example according to the invention according to FIG. 8A, the depth of focus could be increased from 0.39 μm to 0.59 μm, and a doubling of the dose variation range could also be achieved.

Since operations are carried out in the substrate contact-making plane shown in the exemplary embodiment with lengths 12 and widths 11 in the critical resolution range, the mask error enhancement factor, as it is known, conventionally acts in a particularly disadvantageous manner here. Therefore, minimum lines or structure width fluctuations are transferred in a non-linear way from the mask to the wafer. By using the exemplary embodiment according to the invention, the enlargement of the process window is therefore accompanied by a particularly effective improvement in the transfer quality and therefore consequently also a reduction in the mask error enhancement factor.

In addition to the larger process window, a decisive advantage of the solution according to the invention involves the fact that, even in the case of a square configuration of the rectangular structures 1 on the mask, considerable ellipticity is achieved for the resist structures. The conventional technique also has closer limits with respect to the ellipticity because, with a smaller period of the contacts in the longitudinal direction of the contacts, the aforementioned enlargement of the mother contacts runs up against limits which are caused by the mask production, such as the minimum land widths which can be inspected or the land widths which can be resolved.

FIG. 8B shows a further exemplary embodiment, according to which the phase-shifting auxiliary openings 2 are disposed horizontally in relation to the contact holes 1. Here, an ellipticity with major semi-axes in the horizontal direction is achieved. The variables used—based on the wafer level—are: length 12 of the contact hole: 230 nm; width 11 of the contact hole; 230 nm; length 22 of the auxiliary opening; 560 nm; cross section 21 of the auxiliary opening: 110 nm: period of the contact holes in the vertical direction: 560 nm. The phase difference is 180 degrees, the filling factor σ is 0.30 and the numerical aperture is 0.63, the wavelength is 248 nm.

Figure 9:
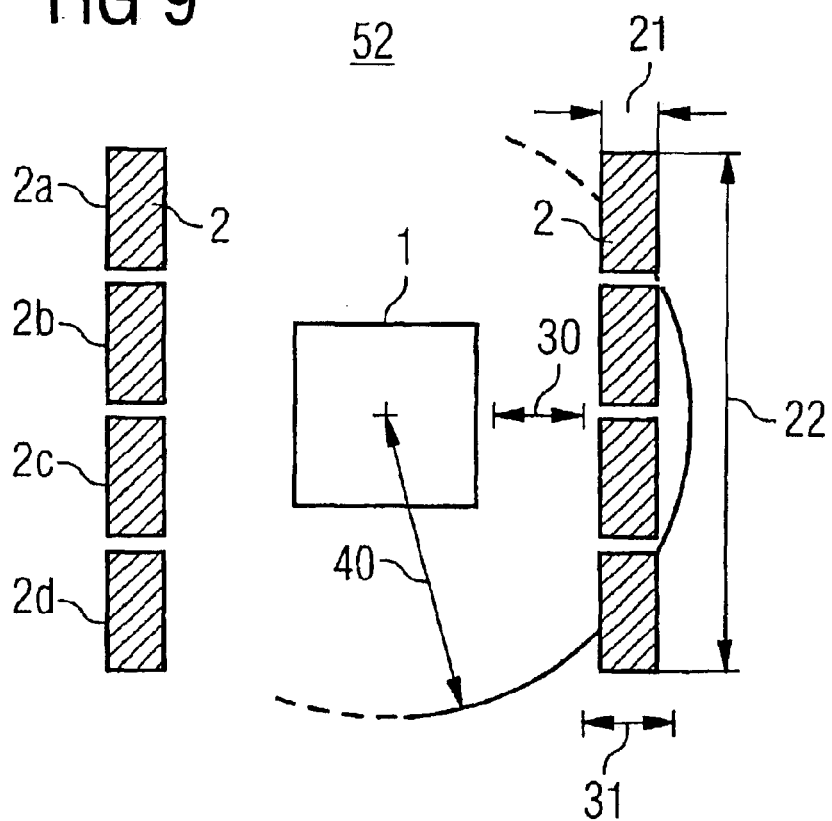
FIG. 9 is a plan view of a mask with a square opening, with two associated auxiliary openings each including four interrupted elongated holes.

FIG. 9 shows a further development of the example according to the invention shown in FIG. 8A. The detail shows the square-shaped rectangular structure 1, which is surrounded on the left and right by two auxiliary openings 2. The auxiliary openings 2 include interrupted elongated holes 2a, 2b, 2c, 2d. The distance of the elongated holes from one another is smaller than the distance of the elongated holes from the rectangular structure 1. In, particular, their distance from one another is less than the resolution limit 30, so that their action on the rectangular structure 1 is substantially the same as that of a continuous auxiliary opening 2, but the interruption of the elongated holes 2a–2d leads to a slight reduction in the area of the auxiliary opening 2, as a result of which the action of the proximity effect caused by the phase structure is correspondingly also reduced slightly. The length 22 of the auxiliary opening 2 remains unchanged by the interruption of the elongated holes 2a–2d.

Figure 10:
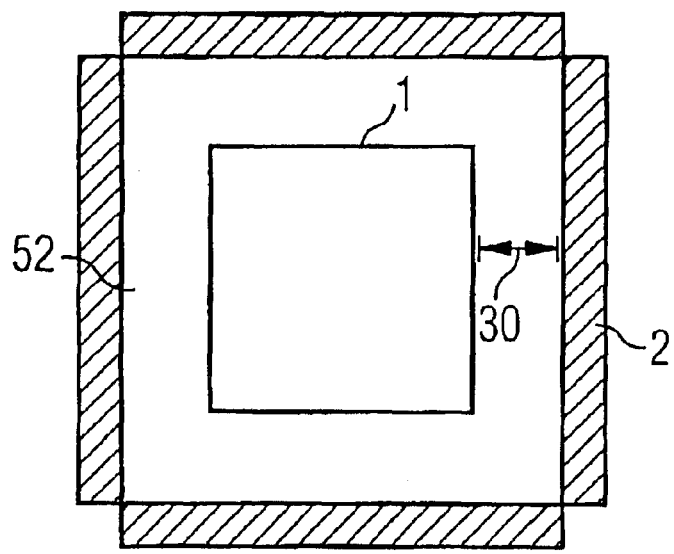
FIG. 10 is a plan view of a square rectangular structure according to the invention made by the mask shown in FIG. 9.

A further configuration according to the invention of four auxiliary openings 2 around a rectangular structure 1 is shown in FIG. 10. In this exemplary embodiment, the aim is not the production of an elliptical structure, rather merely the enlargement of the process window for the imaging of the rectangular structure 1 onto the wafer is utilized. The rectangular structure 1 shown in FIG. 10 is not necessarily square, according to the present invention. It is further possible even for further auxiliary openings 2 disposed downstream of and behind the auxiliary openings of FIG. 10 to be formed, which are still located within the range of the coherence length 40 shown in FIG. 10. However, it is also necessary here to satisfy the further conditions that the overall width 21 of the auxiliary opening 2 does not exceed the limiting dimension 31, so that no imaging of the auxiliary openings 2 on the wafer can take place.

We claim:

1. A photolithographic mask for exposing a radiation-sensitive resist layer on a semiconductor substrate, comprising:
   a transparent carrier material; and
   a layer opaque to radiation disposed on said transparent carrier material;
   said layer opaque to radiation having a number of openings each with a square structure formed therein and forming a first pattern, said openings configured to be transferred into a resist layer during an exposure; and
   said layer opaque to radiation further having a further number of auxiliary openings formed therein and forming a second pattern, each of said auxiliary openings being assigned to a respective one of said openings and:
      having a cross section with a width below a limiting dimension to prevent said second pattern from being transferred to the resist layer during the exposure,
      being disposed at a distance from the respective one of said openings, said distance:
         being greater than a resolution limit of a projection apparatus used for the exposure based on a wafer scale,
         being less than a coherence length of light used in the projection apparatus, and
      producing a phase difference between 160 degrees and 200 degrees with respect to radiation passing through the respective one of said openings;
   said first pattern and said second pattern being a regular pattern; and
   said auxiliary openings having a length exceeding the resolution limit, a width exceeding the limiting dimension for the structure formation on the wafer, and an identical longitudinal alignment.

2. The mask according to claim 1, wherein said length of each of said auxiliary openings at least equals said length of said respective one of said openings.

3. The mask according to claim 1, wherein:
   each of said auxiliary openings has an axis of symmetry; and
   said layer opaque to radiation has a respective further auxiliary opening disposed mirror-symmetrically about said axis of symmetry of each of said auxiliary opening.

4. The mask according to claim 1, wherein said auxiliary openings form a number of non-coherent rectangles having a distance from one another less than each distance from one of said openings other than said respective one of said openings.

5. The mask according to claim 1, wherein characterized in that the openings are in each case surrounded by a plurality of auxiliary openings associated with it.

6. The mask according to claim 1, wherein:
   said openings are transparent; and
   each of said auxiliary openings are at least semi-transparent.

7. The mask according to claim 6, wherein each of said auxiliary openings are transparent.

8. The mask according to claim 1, wherein said cross section with said width has an extent below the resolution limit of the projection apparatus, as based on a scale of the mask.

9. A method of producing structures on wafers, which comprises exposing a wafer by passing light from an optical projection apparatus through at least one of the openings of the mask according to claim 1 to produce a structure, the structure having a ratio of length to width greater than a ratio of length to width of the at least one opening on the mask.

10. A method of exposing a wafer, which comprises:
   providing a projection apparatus having a numerical aperture and the mask according to claim 1;
   determining a length to width ratio to be achieved for a structure to be imaged on a wafer by one of the openings of the mask;
   setting the numerical aperture of the projection apparatus at least as a function of:
      a) a length and a width of the one of the openings,
      b) a length and a width of the respective one of the auxiliary openings,
      c) a distance from the respective one of the auxiliary openings to the opening associated with the auxiliary opening, and
      d) the length to width ratio to be achieved.

11. The method according to claim 10, which further comprises carrying out a numerical simulation taking dependencies into account to set the numerical aperture.

12. The mask according to claim 1, wherein said pattern of auxiliary openings influences the resist layer.

* * * * *